United States Patent [19]

Ohtawa et al.

[11] Patent Number: 5,344,747
[45] Date of Patent: Sep. 6, 1994

[54] PHOTOPOLYMERIZABLE COMPOSITIONS

[75] Inventors: Shigeru Ohtawa, Yamato; Junichi Onodera, Samukawa; Kouji Harada, Yamato, all of Japan

[73] Assignee: Tokyo Ohka Kogyo Co., Ltd., Japan

[21] Appl. No.: 871,142

[22] Filed: Apr. 20, 1992

Related U.S. Application Data

[60] Division of Ser. No. 622,320, Dec. 6, 1990, Pat. No. 5,147,759, which is a continuation of Ser. No. 332,917, Apr. 4, 1989, abandoned.

[30] Foreign Application Priority Data

Apr. 15, 1988 [JP] Japan .................................. 63-91262

[51] Int. Cl.$^5$ ................................................ G03F 7/32
[52] U.S. Cl. ...................................... 430/325; 430/323
[58] Field of Search ............... 430/285, 325, 281, 271, 430/323

[56] References Cited

U.S. PATENT DOCUMENTS 4,157,261 6/1979 Takeda .
4,636,534 1/1987 Nawata et al. .
4,725,524 2/1988 Elzer et al. .
4,764,452 8/1988 Ohno .

FOREIGN PATENT DOCUMENTS 292219 11/1988 European Pat. Off. .
59-171949 9/1984 Japan .
60-258275 12/1985 Japan .
62-034149 2/1987 Japan .
63-261254 10/1988 Japan .
2171107 8/1986 United Kingdom .

OTHER PUBLICATIONS

Chemical Abstract No. 102:15117s (1985).

*Primary Examiner*—Christopher Rodee
*Attorney, Agent, or Firm*—Lowe, Price, LeBlanc & Becker

[57] ABSTRACT

A photopolymerizable composition composed principally of an acrylic linear copolymer, an ethylenically-unsaturated compound and a photoinitiator and adapted to fabricate printed circuit boards. The ethylenically-unsaturated compound contains a specific acrylic ester. The photopolymerizable composition can be developed with an aqueous mild alkaline solution.

7 Claims, No Drawings

PHOTOPOLYMERIZABLE COMPOSITIONS

This application is a divisional of application Ser. No. 07/622,320 filed Dec. 6, 1990, now U.S. Pat. No. 5,147,759 which is a continuation of application Ser. No. 07/332,917 filed Apr. 4, 1989 now abandoned.

FIELD OF THE INVENTION

This invention relates to photopolymerizable compositions useful upon fabrication of printed circuit boards.

BACKGROUND OF THE INVENTION

A photopolymerizable composition is used for the fabrication of printed circuit boards. Namely, a printed circuit board is fabricated in the following manner. For example, the copper surface of a coppercoated substrate is first of all coated with a composition which is a solution of a photopolymerizable resin or a photopolymerizable film formed beforehand into the shape of a film is laminated on the copper surface of the copper-coated substrate, whereby a resist film is formed. The resist film is next exposed imagewise to radiation and thereafter developed with a solvent or an aqueous alkaline solution to form a resist pattern on the copper-coated substrate. Copper surface areas not protected by the resist pattern are subjected to selective etching, metal plating or the like to fabricate a printed circuit board.

To improve the working efficiency, air pollution problem and yield, dry film resists are used in recent years. These dry film resists can be developed with an aqueous alkaline solution. They are three-layered laminates having flexibility, namely, are formed of a base film layer, a photopolymerizable resin layer and a protective film.

As photopolymerizable compositions which can be developed with an aqueous alkaline solution, are generally used those composed of an acrylic copolymer containing carboxyl, amino or hydroxyl groups, a photopolymerizable monomer and a photoinitiator.

Such photopolymerizable compositions are etched and removed with an aqueous strong alkaline solution. However, their etching are very time-consuming. As a consequence, a copper wiring or a solder plating layer provided over the copper wiring is corroded with the strongly alkaline etchant so that the wiring patter may be partly lost or cut off. If the solder plating employed as an etching mask upon etching the copper surface area is corroded with an etchant, the solder plating would no longer be used as an etching mask.

OBJECT OF THE INVENTION

An object of this invention is to provide a photopolymerizable composition which can be etched off with an aqueous strong alkaline solution in a short time.

DESCRIPTION OF THE INVENTION

In this invention, the photopolymerizable composition is composed principally of (a) an acrylic linear copolymer, (b) an ethylenically-unsaturated compound and (c) a photoinitiator. The ethylenicallyunsaturated compound contains 10–50 wt.%, based on the total amount of the component (b), of an acrylic ester represented by the following formula:

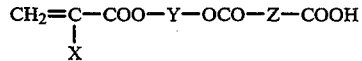

wherein X means a hydrogen atom or methyl group, Y denotes an alkylene group having 1–3 carbon atoms, and Z stands for a direct bond, an alkylene group having 1–8 carbon atoms or a phenylene or cyclohexylene group.

Each of the above components will hereinafter be described in detail.

[Component (a)]

The component (a) of the composition according to this invention is an acrylic linear copolymer and can be obtained by copolymerizing two or more monomers. As exemplary monomers permitting such copolymerization, the following compounds may be mentioned:
methyl acrylate;
methyl methacrylate;
ethyl acrylate;
ethyl methacrylate;
butyl acrylate;
butyl methacrylate;
acrylic acid;
methacrylic acid;
2-hydroxyethyl acrylate;
2-hydroxyethyl methacrylate;
2-hydroxypropyl acrylate;
2-hydroxypropyl methacrylate;
glycidyl acrylate;
glycidyl methacrylate;
tert-butylaminoethyl acrylate;
tert-butylaminoethyl methacrylate;
2,3-dibromopropyl acrylate;
2,3-dibromopropyl methacrylate;
3-chloro-2-hydroxypropyl acrylate;
3-chloro-2-hydroxypropyl methacrylate;
tetrahydrofurfuryl acrylate;
tetrahydrofurfuryl methacrylate;
tribromophenyl acrylate;
tribromophenyl methacrylate;
acrylamide;
methacrylamide;
acrylonitrile;
methacrylonitrile;
styrene;
α-methylstyrene;
vinyltoluene; and
butadiene.

In the present invention, the component (a) may desirably have a weight average molecular weight of 30,000–200,000 and a glass transition point of 20°–80° C. If the weight average molecular weight is smaller than the lower limit, the resulting resist pattern has insufficient strength. On the other hand, any weight average molecular weights greater than the upper limit lead to poor adhesion to the substrate. If the glass transition point is lower than the lower limit, a layer of the resulting photopolymerizable resin formed into a film may run out even at room temperature so that the photopolymerizable resin cannot be used as a dry film resist. If the glass transition point is higher than the upper limit, the resulting photopolymerizable resin cannot fill up concave portions of a rough substrate upon application of the photopolymerizable resin on the substrate. Any weight average molecular weight and glass transition point outside their respective ranges mentioned above are therefore not preferred.

[Component (b)]

The component (b) in the composition of this invention is an ethylenically-unsaturated compound which forms a polymer under the action of a photoinitiator. It contains, as an essential component, 10–50 wt.%, based on the total amount of the component (b), of an acrylic ester represented by the following formula:

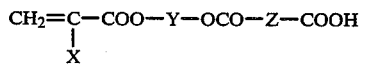

wherein X means a hydrogen atom or methyl group, Y denotes an alkylene group having 1-3 carbon atoms, and Z stands for a direct bond, an alkylene group having 1-8 carbon atoms or a phenylene or cyclohexylene group.

The following compounds may be mentioned as illustrative examples of the acrylic ester, although not necessarily limited thereto:

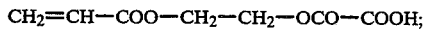
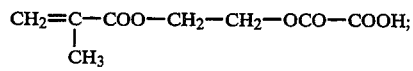
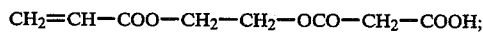
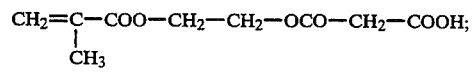
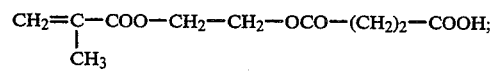
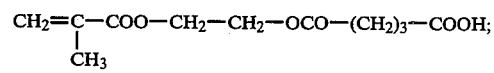
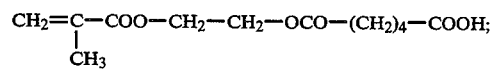
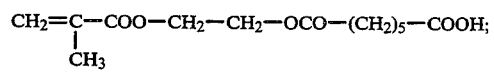
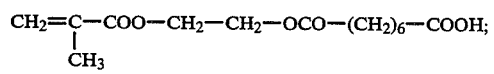
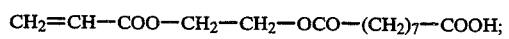
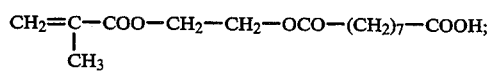
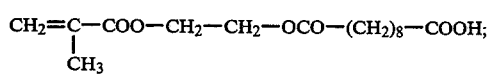

-continued

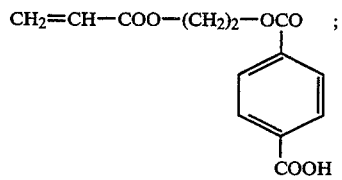
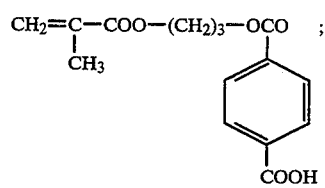
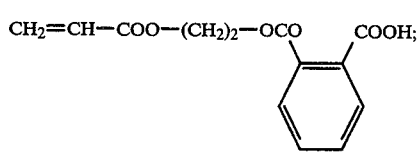
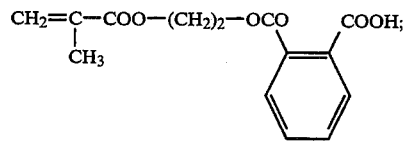
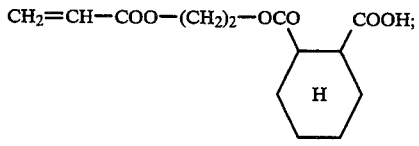
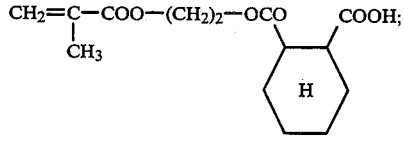
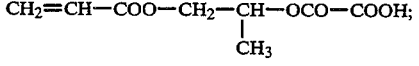
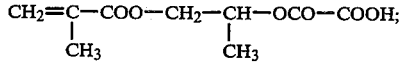
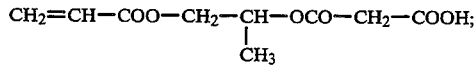
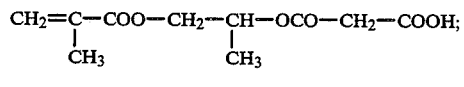
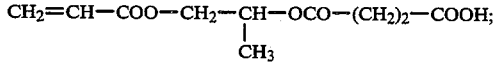
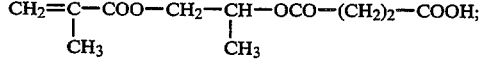
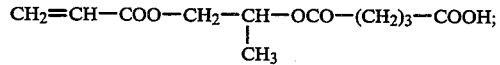

-continued

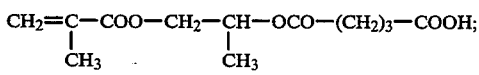

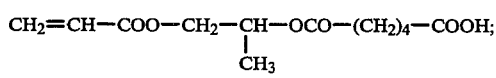

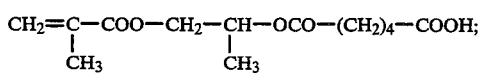

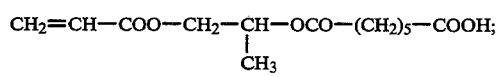

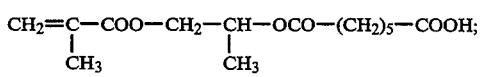

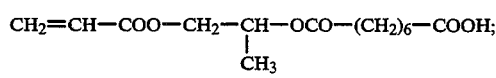

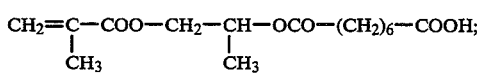

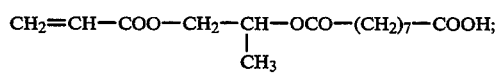

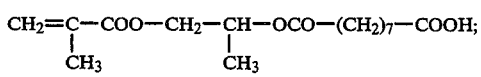

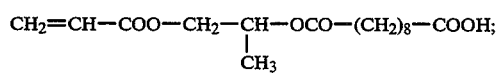

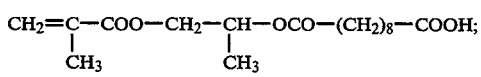

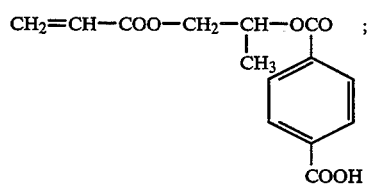

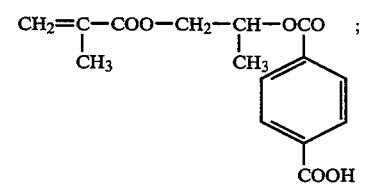

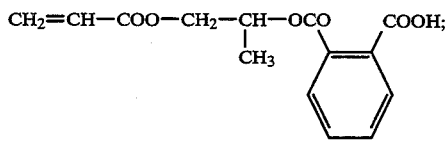

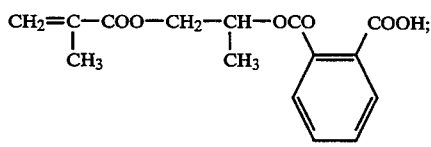

-continued

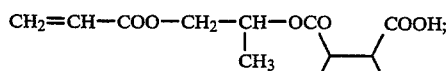

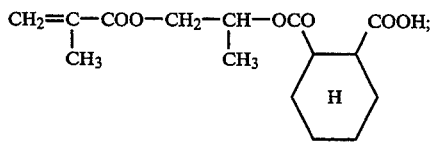

As an exemplary process for the synthesis of such an acrylic ester, the acrylic ester can be obtained as a dicarboxylate monoester by conducting an esterification reaction of an acrylic or methacrylic acid and an alkanediol to form a hydroxyalkyl acrylate or methacrylate and then subjecting the hydroxyalkyl acrylate or methacrylate to an esterification reaction with a dicarboxylic acid.

Exemplary alkanediols useful as a reactant in the above process may include dihydroxymethane, ethylene glycol, propylene glycol, and 1,3-propanediol.

Illustrative of the dicarboxylic acid may include oxalic acid, malonic acid, succinic acid, glutaric acid, adipic acid, pimelic acid, suberic acid, azelaic acid, sebacic acid, phthalic acid, terephthalic acid, and cyclohexanedicarboxylic acid.

The above acrylic ester is used in combination with at least one of other ethylenically-unsaturated compounds to make up the component (b). As illustrative examples of such a compound, may be mentioned acrylic esters other than those described above, methacrylic esters, acrylic amides, methacrylic amides, allyl compounds, vinyl ether compounds, and vinyl ester compounds.

As exemplary alcohols useful to form an acrylic or methacrylic ester, may be mentioned propyl alcohol, ethylene glycol, polyethylene glycol, propylene glycol, polypropylene glycol, neopentyl glycol, trimethylolethane.

As exemplary acrylic amides and methacrylic amides, may be mentioned methylenebis(acrylamide), methylenebis(methacrylamide), polyamines such as ethylenediamine and hexamethylenediamine, and acid amides with acrylic acid or methacrylic acid.

Illustrative allyl compounds may include the diallyl esters of phthalic acid, adipic acid, malonic acid and the like.

Vinyl ether compounds are the polyvinyl ethers of polyhydric alcohols. As exemplary polyhydric alcohols, may be mentioned ethylene glycol, polyethylene glycol, propylene glycol, polypropylene glycol, neopentyl glycol, trimethylolpropane, pentaerythritol, butanediol, and trimethylolethane.

As vinyl ester compounds, may be mentioned divinyl succinate, divinyl adipate and divinyl phthalate by way of example.

The proportion of the ethylenically-unsaturated compound in the photopolymerizable composition may desirably range from 10 parts by weight to 100 parts by weight per 100 parts by weight of the component (a).

[Component (c)]

The component (c) in the composition of this invention is a photoinitiator capable of triggering the polymerization of the ethylenically-unsaturated compound, namely, the component (b) upon exposure to radiation. Illustrative examples of the component (c), may be mentioned anthraquinone and its derivatives such as 2-methylanthraquinone and 2-ethylanthraquinone; benzoine and its derivatives such as benzoine methyl ether; benzophenone; phenanthrene; and 4,4'-bis(dimethylamino)benzophenone.

These photoinitiators may be used either singly or in combination.

The photopolymerizable composition of this invention may desirably contain the photoinitiator in a proportion of from 1 part by weight to 15 parts by weight per 100 parts by weight of the component (a).

[Optional Components]

In addition to the essential components described above, the photopolymerizable composition of this invention may also contain one or more of heat polymerization inhibitor, dye, pigment, coatability improver, flame-retardant agent, flame-retardant aid and the like as optional components. They may be chosen in accordance with the same standard as for conventional photopolymerizable compositions.

[Preparation Method and Application Method]

The photopolymerizable composition of this invention can be prepared by either dissolving or dispersing the individual components in a suitable solvent.

As typical examples of the suitable solvent, may be mentioned methyl ethyl ketone, ethyl acetate, toluene, methylene chloride and trichloroethane although not necessarily limited thereto.

Upon application of the photopolymerizable composition of this invention, a copper-coated substrate is coated directly with a solution of the photopolymerizable composition in such a solvent as mentioned above, followed by drying to form a resist film. As an alternative, a polyester film as an exemplary base film is coated with the above solution, followed by drying to form a resist film. The resist film is laminated under heat on a copper-coated substrate. The resist film is exposed selectively to radiation and then developed to form a resist pattern on the substrate. Copper surface areas not protected by the resist pattern are subjected to selective etching, metal plating or the like to fabricate a printed circuit board.

[Developer]

The developer employed after the selective exposure of the photopolymerizable composition of this invention is an aqueous mild alkaline solution.

As exemplary bases useful for the preparation of the aqueous mild alkaline solution, may be mentioned:

alkali metal hydroxides, namely, lithium hydroxide, sodium hydroxide and potassium hydroxide;

alkali metal carbonates and bicarbonates, namely, lithium carbonate and bicarbonate, sodium carbonate and bicarbonate, and potassium carbonate and bicarbonate;

alkali metal phosphates such as sodium phosphate and potassium phosphate;

alkali metal pyrophosphates such as sodium pyrophosphate and potassium pyrophosphate;

primary amines such as benzylamine and butylamine;

secondary amines such as dimethylamine, benzylmethylamine and diethanolamine;

tertiary amines such as trimethylamine, triethylamine and triethanolaine;

cyclic amines such as morpholine, piperazine, piperidine and pyridine;

polyamines such as ethylenediamine and hexamethylenediamine;

ammonium hydroxides such as tetramethylammonium hydroxide, tetraethylammonium hydroxide, trimethylbenzylammonium hydroxide, trimethylphenylammonium hydroxide; and sulfonium hydroxides such as trimethylsulfonium hydroxide, diethylmethylsulfonium hydroxide and dimethylbenzylsulfonium hydroxide.

[Etchant]

As a base useful for the preparation of an aqueous strong alkaline solution employed as an etchant, it is possible to use the same base as that employed for the preparation of a developer.

DESCRIPTION OF THE PREFERRED EMBODIMENTS

To illustrate the present invention in more detail, certain examples of this invention will hereinafter be described.

Examples 1–8 & Comparative Examples 1–5:

Photopolymerizable compositions of the belowdescribed Formulation 1 were prepared respectively by using the ethylenically-unsaturated compounds shown in Table 1.

TABLE 1

Ethylenically-unsaturated compound

Ex. 1  $CH_2=C-COO-(CH_2)_2-OCO-(CH_2)_2-COOH$
       $\quad\quad |$
       $\quad\quad CH_3$ ("NK ESTER SA", trade name; product of Shin-Nakamura Chemical Co., Ltd.)

Ex. 2 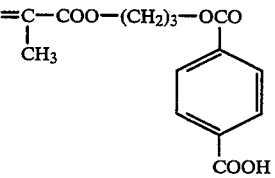

("NK ESTER CB-1", trade name; product of Shin-Nakamura Chemical Co., Ltd.)

Ex. 3 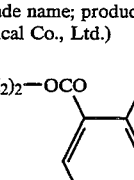

("ARONIX M5400", trade name; product of Toagosei Chemical Industry Co., Ltd.)

Ex. 4 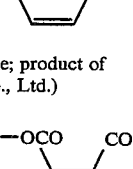

("NK ESTER ACB-200", trade name; product of Shin-Nakamura Chemical Co., Ltd.)

TABLE 1-continued

| | Ethylenically-unsaturated compound |
|---|---|
| Ex. 5 | $CH_2=CH-COO-(CH_2)_2-OCO-$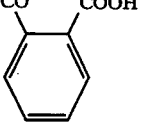$-COOH$ |
| | ("OE-A100", trade name; product of Japan Catalytic Chemical Industry Co., Ltd.) |
| Ex. 6 | $CH_2=CH-COO-(CH_2)_2-OCO-(CH_2)_3-COOH$ ("OE-A120", trade name; product of Nippon Shokubai Kagaku Kogyo Co. Ltd.) |
| Ex. 7 | $CH_2=CH-COO-(CH_2)_3-OCO-(CH_2)_8-COOH$ (Monoester of hydroxypropyl acrylate and sebacic acid) |
| Ex. 8 | $CH_2=C(CH_3)-COO-(CH_2)_2-OCO-(CH_2)_4-COOH$ (Monoester of hydroxyethyl methacrylate and adipic acid) |
| Comp. Ex. 1 | Tetraethyleneglycol dimethacrylate ("PEG400PA", trade name; product of Nippon Kayaku Co., Ltd.) |
| Comp. Ex. 2 | Methoxynonaethyleneglycol monomethacrylate ("NK ESTER M-90G", trade name; product of Shin-Nakamura Chemical Co., Ltd.) |
| Comp. Ex. 3 | 1,6-Hexanediol diacrylate ("LITE ESTER 1,6HX", trade name; product Kyoeisha Chemical Co., Ltd.) |
| Comp. Ex. 4 | Trimethylolpropane triacrylate ("TMPTA", trade name; product of Nippon Kayaku Co., Ltd.) |
| Comp. Ex. 5 | Tetraethyleneglycol diacrylate (product of Osaka Organic Chemical Ind. Co., Ltd.) |

| [Formulation 1] | Parts by weight |
|---|---|
| Acrylic linear copolymer (methyl methacrylate/ethyl methacrylate/methacrylic acid "NK ESTER ACB-200" = 40/30/20/10, by weight) | 100 |
| Ethylenically-unsaturated compound | 5 |
| Trimethylolpropane triacrylate | 20 |
| Tetraethyleneglycol diacrylate | 20 |
| Benzophenone | 5 |
| 4,4'-Bis(dimethylamino)benzophenone | 0.6 |
| Crystal violet | 0.1 |
| Benzotriazole | 0.1 |
| Methyl ethyl ketone | 300 |

Polyethylene terephthalate films of 25 μm thick was uniformly coated with the above photopolymerizable compositions respectively, followed by drying to obtain resist films of 30 μm thick. The films with the resist films formed from the respective photopolymerizable compositions were respectively laminated on copper-coated substrates whose surfaces had been toughened by oscillation buffing. The lamination was effected by bringing the resist film of each film into a contiguous relation with the toughened surface of the corresponding copper-coated substrate and laminating the film on the substrate by means of a hot roll laminator.

The resist film of each substrate was then exposed, from the side of the polyethylene terephthalate film and through a negative film, to radiation of 90 mJ/cm² from a 3-kW ultra-high-pressure mercury vapor lamp ("HMW-201B" model; manufactured by ORK MFG. CO., Ltd.). After removing the polyethylene terephthalate film on the resist film, the resist film was developed for 80 seconds with a 1.5% aqueous sodium carbonate solution of 32° C. in a spray developing machine, washed with water, and thereafter dried.

The copper-coated substrate with the resist pattern formed thereon was then dipped in a plating bath of copper sulfate, so that the areas not covered by the resist pattern were subjected to electrolytic copper plating. At that time, the temperature of the plating bath was 60° C. The dipping time was 40 minutes.

The copper-plated substrate was thereafter dipped at 25° C. for 15 minutes in a solder plating bath to conduct solder plating.

A 3% aqueous sodium hydroxide solution of 50° C. was then sprayed at a pressure of 1.8 kg/cm² against the thus-plated substrate to remove the resist. The time required for the removal of the resist was measured. The results are shown in Table 2. After spraying the above-described aqueous solution of sodium hydroxide for a period twice as long as the time required for the removal, the state of corrosion of the plated solder layer was observed. The results are summarized in Table 3.

TABLE 2

| | Lift-off time (sec) |
|---|---|
| Example 1 | 50–55 |
| Example 2 | 60–65 |
| Example 3 | 55–60 |
| Example 4 | 55–60 |
| Example 5 | 50–55 |
| Example 6 | 45–50 |
| Example 7 | 55–60 |
| Example 8 | 60–65 |
| Comp. Ex. 1 | 90–100 |
| Comp. Ex. 2 | 80–90 |
| Comp. Ex. 3 | 100–110 |
| Comp. Ex. 4 | 110–120 |
| Comp. Ex. 5 | 90–100 |

TABLE 3

| | State of corrosion of solder plating |
|---|---|
| Example 1 | ○ |
| Example 2 | ○ |
| Example 3 | ○ |
| Example 4 | ○ |
| Example 5 | ○ |
| Example 6 | ○ |
| Example 7 | ○ |
| Example 8 | ○ |
| Comp. Ex. 1 | X |
| Comp. Ex. 2 | Δ |
| Comp. Ex. 3 | X |
| Comp. Ex. 4 | X |
| Comp. Ex. 5 | X |

○ ... No substantial film thickness reduction.
Δ ... Film thickness reduction of 10-20%.
X ... Film thickness reduction of 20% or more.

Examples 9–16 & Comparative Examples 6–10:

Photopolymerizable compositions of the belowdescribed Formulation 2 were prepared respectively by using the ethylenically-unsaturated compounds shown in Table 4.

TABLE 4

| | Ethylenically-unsaturated compound |
|---|---|
| Example 9 | Same as Example 1 |
| Example 10 | Same as Example 2 |
| Example 11 | Same as Example 3 |
| Example 12 | Same as Example 4 |
| Example 13 | Same as Example 5 |

TABLE 4-continued

| | Ethylenically-unsaturated compound |
|---|---|
| Example 14 | Same as Example 6 |
| Example 15 | Same as Example 7 |
| Example 16 | Same as Example 8 |
| Comp. Ex. 6 | Same as Comp. Ex. 1 |
| Comp. Ex. 7 | Same as Comp. Ex. 2 |
| Comp. Ex. 8 | Same as Comp. Ex. 3 |
| Comp. Ex. 9 | Same as Comp. Ex. 4 |
| Comp. Ex. 10 | Same as Comp. Ex. 5 |

[Formulation 2]

| | Parts by weight |
|---|---|
| Acrylic linear copolymer (methyl methacrylate/isobutyl methacrylate/acrylic acid = 40/30/30, by weight) | 100 |
| Ethylenically-unsaturated compound | 25 |
| Ethylene glycol dimethacrylate | 20 |
| Trimethylolpropane triacrylate | 20 |
| Benzophenone | 5 |
| 4,4'-Bis(dimethylamino)benzophenone | 0.6 |
| Malachite green | 0.1 |
| Benzotriazole | 0.1 |
| Methyl ethyl ketone | 300 |

In a similar manner as in Examples 1–6 and Comparative Examples 1–5 except for the use of the ethylenically-unsaturated compounds given in Table 4, resist patterns were formed on copper-coated substrates respectively and after conducting copper plating and solder plating, the resists were removed with a 3% aqueous sodium hydroxide solution of 50° C. The time required for the removal of each of the resists was measured. The results are shown in Table 5. After spraying the above-described aqueous solution of sodium hydroxide for a period twice as long as the time required for the lift-off of each of the resists, the state of corrosion of the corresponding plated solder layer was observed. The results are summarized in Table 6.

TABLE 5

| | Lift-off time (sec) |
|---|---|
| Example 9 | 55–60 |
| Example 10 | 65–70 |
| Example 11 | 60–65 |
| Example 12 | 60–65 |
| Example 13 | 55–60 |
| Example 14 | 50–55 |
| Example 15 | 60–65 |
| Example 16 | 65–70 |
| Comp. Ex. 6 | 100–110 |
| Comp. Ex. 7 | 90–100 |
| Comp. Ex. 8 | 110–120 |
| Comp. Ex. 9 | 120–130 |
| Comp. Ex. 10 | 100–110 |

TABLE 6

| | State of corrosion of solder plating |
|---|---|
| Example 9 | ○ |
| Example 10 | ○ |
| Example 11 | ○ |
| Example 12 | ○ |
| Example 13 | ○ |
| Example 14 | ○ |
| Example 15 | ○ |
| Example 16 | ○ |
| Comp. Ex. 6 | X |
| Comp. Ex. 7 | X |
| Comp. Ex. 8 | X |
| Comp. Ex. 9 | X |
| Comp. Ex. 10 | X |

○ ... No substantial film thickness reduction.
X ... Film thickness reduction of 20% or more.

Owing to the use of the specific ethylenically-unsaturated compound, the photopolymerizable composition according to this invention allows to perform etching with a mild alkaline etchant in a short period of time so that the corrosion of the metal wiring pattern and solder plating layer can be minimized and the yield can hence be improved.

Having described specific embodiments of our bearing, it is believed obvious that modification and variation of our invention is possible in light of the above teachings.

What is claimed is:

1. A method of forming a pattern, comprising
   (a) dissolving or dispersing in an organic solvent a photopolymerizable composition consisting essentially of (i) a linear acrylic copolymer having a weight average molecular weight of 30,000 to 200,000 and a glass transition point of 20°–80° C., (ii) an ethylenically-unsaturated component comprising 10–50 wt. %, based on the total amount of the ethylenically-unsaturated component, of an acrylic ester of the formula $CH_2=C(X)-COO-Y-OCO-Z-COOH$, wherein X is selected from the group of hydrogen and methyl, Y is $(C_1-C_3)$alkylene, and Z is selected from the group consisting of a single bond, $(C_1-C_8)$ alkylene, phenylene, and cyclohexylene, and (iii) a photoinitiator, the weight ratio of the ethylenically-unsaturated component to the acrylic copolymer being 0.1:1 to 1:1;
   (b) coating a substrate directly with the resulting solution;
   (c) drying the coated substrate to form a resist film;
   (d) exposing the dried resist film imagewise to radiation; and
   (e) developing the resist film with an aqueous alkaline solution.

2. The method of claim 1, wherein the linear acrylic copolymer is formed from monomers selected from the group consisting of methyl acrylate; methyl methacrylate; ethyl acrylate; ethyl methacrylate; butyl acrylate; butyl methacrylate; acrylic acid; methacrylic acid; 2-hydroxyethyl acrylate; 2-hydroxyethyl methacrylate; 2-hydroxypropyl acrylate; 2-hydroxypropyl methacrylate; glycidyl acrylate; glycidyl methacrylate; tert-butylaminoethyl acrylate; tert-butylaminoethyl methacrylate; 2,3-dibromopropyl acrylate; 2,3-dibromopropyl methacrylate; 3-chloro-2-hydroxypropyl acrylate; 3-chloro-2-hydroxypropyl methacrylate; tetrahydrofurfuryl acrylate; tetrahydrofurfuryl methacrylate; tribromophenyl acrylate; tribromophenyl methacrylate; acrylamide; methacrylamide; acrylonitrile; methacrylonitrile; vinyltoluene; and butadiene, at least one of said monomers forming the copolymer comprising an acrylic monomer.

3. The method of claim 1, wherein
   Y is selected from the group consisting of ethylene and isopropylene.

4. The method of claim 1, wherein

Z is selected from the group consisting of a single bond, methylene, ethylene, propylene, butylene, pentylene, hexylene, heptylene, octylene, o-phenylene, p-phenylene and 1,2-cyclohexylene.

5. The method of claim 1, wherein the photoinitiator is present in a proportion of 1–15 parts per 100 parts by weight of the acrylic copolymer.

6. The method of claim 1, wherein the substrate comprises a polyester film.

7. The method of claim 1, wherein the radiation to which the dried resist film is exposed comprises ultra-violet radiation.

* * * * *